(12) United States Patent
Sorensen et al.

(10) Patent No.: US 8,075,734 B2
(45) Date of Patent: Dec. 13, 2011

(54) REMOTE INDUCTIVELY COUPLED PLASMA SOURCE FOR CVD CHAMBER CLEANING

(75) Inventors: Carl A. Sorensen, Morgan Hill, CA (US); Jozef Kudela, Nishinomiya (JP)

(73) Assignee: Applied Materials, Inc., Santa Clara, CA (US)

( * ) Notice: Subject to any disclaimer, the term of this patent is extended or adjusted under 35 U.S.C. 154(b) by 773 days.

(21) Appl. No.: 12/114,127

(22) Filed: May 2, 2008

(65) Prior Publication Data

US 2009/0008239 A1  Jan. 8, 2009

Related U.S. Application Data

(60) Provisional application No. 60/948,290, filed on Jul. 6, 2007.

(51) Int. Cl.
*C23C 16/00* (2006.01)
*H01L 21/306* (2006.01)

(52) U.S. Cl. .............................. 156/345.48; 118/723 IR

(58) Field of Classification Search ................ 118/723 I, 118/723 IR, 723 AN; 156/345.48, 345.49; 315/111.51

See application file for complete search history.

(56) References Cited

U.S. PATENT DOCUMENTS

| | | | | |
|---|---|---|---|---|
| 4,362,632 A | * | 12/1982 | Jacob | 422/186.04 |
| 4,810,935 A | * | 3/1989 | Boswell | 315/111.41 |
| 4,988,644 A | * | 1/1991 | Jucha et al. | 438/710 |
| 5,036,252 A | * | 7/1991 | Lob | 315/111.31 |
| 5,309,063 A | * | 5/1994 | Singh | 315/111.51 |
| 5,844,195 A | | 12/1998 | Fairbairn et al. | |
| 5,902,404 A | | 5/1999 | Fong et al. | |
| 6,109,206 A | | 8/2000 | Maydan et al. | |
| 6,116,186 A | * | 9/2000 | Li et al. | 118/723 ER |
| 6,144,984 A | | 11/2000 | DeBenedictis et al. | |
| 6,436,303 B1 | | 8/2002 | Kim et al. | |
| 6,603,269 B1 | | 8/2003 | Vo et al. | |
| 6,828,241 B2 | | 12/2004 | Kholodenko et al. | |
| 2004/0163767 A1 | * | 8/2004 | Ueda et al. | 156/345.49 |

FOREIGN PATENT DOCUMENTS

| | | |
|---|---|---|
| CN | 1556241 A | 12/2004 |
| CN | 1812687 A | 8/2006 |

OTHER PUBLICATIONS

Decision on Rejection for Chinese Patent Application No. 200810111506.4 dated Nov. 18, 2010.
The First Office Action for Chinese Patent Application No. 200810111506.4 dated May 11, 2010.
Second Office Action for Chinese Patent Application No. 2008101115064 dated Apr. 21, 2011.
Li, Yunqing, "Heat Exchange and Heat Exchanger in Chemical Unit Operation," Chemical Industry Press, Sep. 30, 1985, pp. 77-80.

* cited by examiner

*Primary Examiner* — Luz L. Alejandro
(74) *Attorney, Agent, or Firm* — Patterson & Sheridan, L.L.P.

(57) ABSTRACT

The present invention generally includes a remote plasma source and a method of generating a plasma in a remote plasma source. Cleaning gas may be ignited into a plasma in a remote location and then provided to the processing chamber. By flowing the cleaning gas outside of a cooled RF coil, a plasma may be ignited at either high or low pressure while providing a high RF bias to the coil. Cooling the RF coil may reduce sputtering of the coil and thus reduce undesirable contaminants from being fed to the processing chamber with the cleaning gas plasma. Reduced sputtering from the coil may extend the useful life of the remote plasma source.

5 Claims, 2 Drawing Sheets

US 8,075,734 B2

REMOTE INDUCTIVELY COUPLED PLASMA SOURCE FOR CVD CHAMBER CLEANING

CROSS-REFERENCE TO RELATED APPLICATIONS

This application claims benefit of U.S. Provisional Patent Application Ser. No. 60/948,290 (APPM/012125L), filed Jul. 6, 2007, which is herein incorporated by reference.

BACKGROUND OF THE INVENTION

1. Field of the Invention

Embodiments of the present invention generally relate to a remote plasma source for producing a plasma to be delivered to a processing chamber.

2. Description of the Related Art

Plasma processes are used for numerous fabrication steps in various device manufacturing applications. For solar panel or flat panel displays, substrate sizes have been increasing in recent years. As the substrate size increases, more plasma may be necessary. Additionally, during processing, material may deposit on exposed areas of the processing chamber. As the material builds up, there is a danger that the material may flake off and contaminate the substrate. By periodically cleaning the processing chamber, undesirable deposits may be removed from the chamber to reduce substrate contamination.

Because the substrates are increasing in size due to the increased demand, more plasma, and in some cases, increased density plasmas may be necessary to effectively clean the processing chamber.

Therefore, there is a need in the art for an improved remote plasma source.

SUMMARY OF THE INVENTION

The present invention generally includes a remote plasma source and a method of generating a plasma in a remote plasma source. Cleaning gas may be ignited into a plasma in a remote location and then provided to the processing chamber. By flowing the cleaning gas outside of a cooled RF coil, a plasma may be ignited at either high or low pressure while providing a high RF bias to the coil. Cooling the RF coil may reduce sputtering of the coil and thus reduce undesirable contaminants from being fed to the processing chamber with the cleaning gas plasma. Reduced sputtering from the coil may extend the useful life of the remote plasma source.

In one embodiment, a remote plasma source is disclosed. The source comprises an enclosure, a gas inlet coupled with the enclosure, a plasma outlet coupled with the enclosure, and a metal tube disposed within the enclosure. The metal tube may have an outside surface and an inside surface. An RF input may be coupled with the outside surface. A first cooling fluid inlet may be coupled with the inside surface.

In another embodiment, a plasma generation method is disclosed. The method comprises flowing a gas into a chamber through a gas inlet, flowing a cooling fluid through the chamber within a cooling tube, flowing an RF current along an outside surface of the cooling tube, igniting a plasma within the chamber, and flowing the plasma out of the chamber through a plasma outlet.

In another embodiment, a plasma apparatus is disclosed. The apparatus comprises a processing chamber, an RF matching network, and a remote plasma source coupled with the processing chamber and the RF matching network. The remote plasma source may comprise an enclosure and a cooling tube disposed within the enclosure. The cooling tube may be coupled with a cooling fluid inlet and outlet. The RF matching network may be coupled with the cooling tube.

In another embodiment, a remote plasma source is disclosed. The source comprises an enclosure and a cooling fluid pathway disposed within the enclosure. The pathway may be coupled with an RF matching network. A gas inlet may be coupled with the enclosure. The gas inlet provides gas into the enclosure such that gas flows outside of the cooling fluid pathway.

In another embodiment, a plasma generation method is disclosed. The method comprises flowing a cooling fluid inside a cooling tube, flowing an RF current along an outside of the cooling tube, and igniting a plasma from gas flowing outside of the cooling tube.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally includes a remote plasma source and a method of generating a plasma in a remote plasma source. Cleaning gas may be ignited into a plasma in a remote location and then provided to the processing chamber. By flowing the cleaning gas outside of a cooled RF coil, a plasma may be ignited at either high or low pressure while providing a high RF bias to the coil. Cooling the RF coil may reduce sputtering of the coil and thus reduce undesirable contaminants from being fed to the processing chamber with the cleaning gas plasma. Reduced sputtering from the coil may extend the useful life of the remote plasma source.

The invention will be illustratively described below in relation to a plasma enhanced chemical vapor deposition (PECVD) chamber available from AKT, a subsidiary of Applied Materials, Inc., Santa Clara, Calif. It is to be understood that the invention is equally applicable to any chamber that may require energizing a gas into a plasma using an RF current including physical vapor deposition (PVD) chambers. It is also to be understood that the invention described below is equally applicable to PECVD chambers and other chambers made by other vendors.

Figure 1:
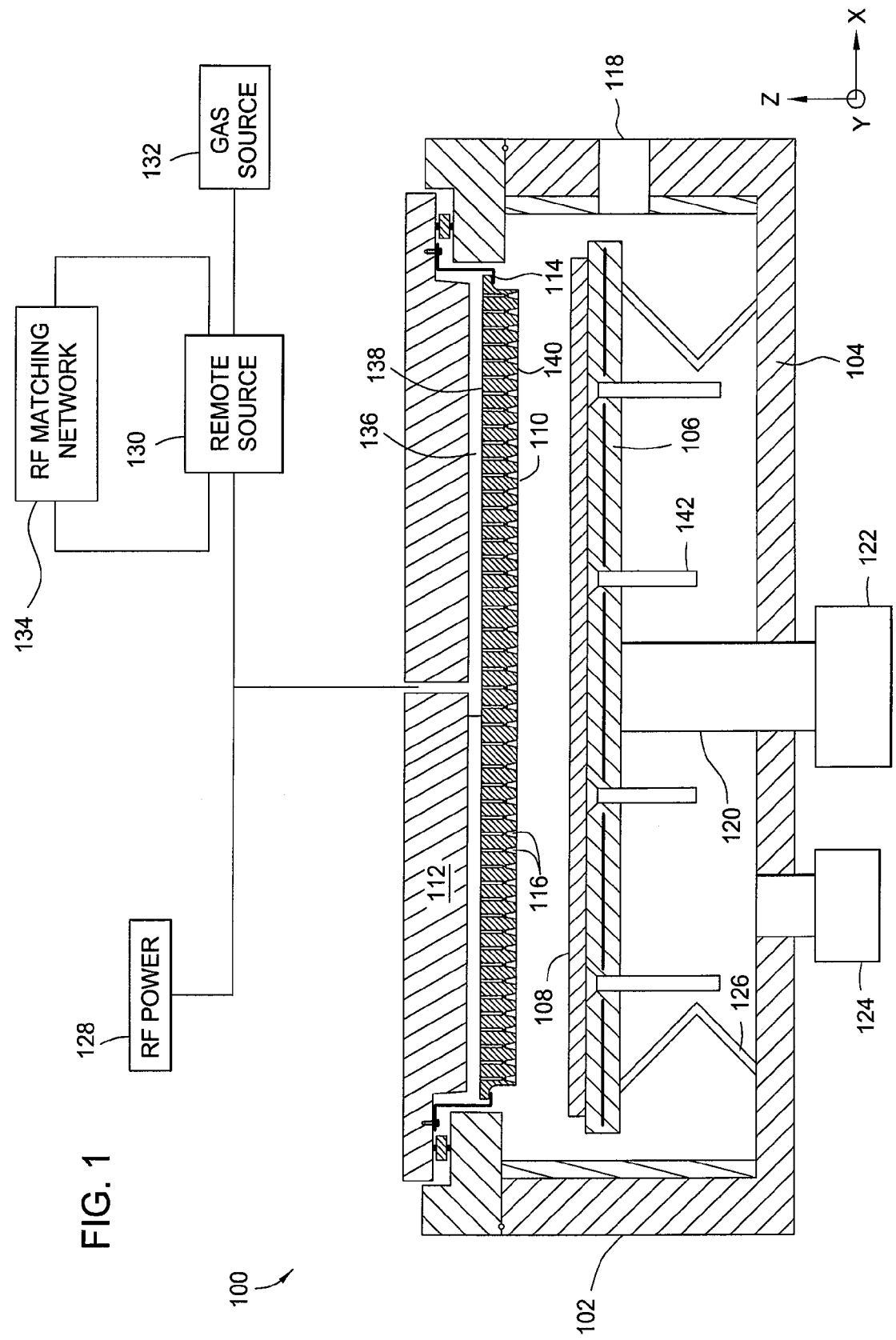
FIG. 1 is a schematic cross sectional view of a processing apparatus according to one embodiment of the invention.

FIG. 1 is a schematic cross sectional view of a processing apparatus 100 according to one embodiment of the invention. The apparatus 100 comprises a PECVD chamber 102. The susceptor 106 may be grounded with grounding straps 126 coupled with the bottom 104 of the chamber 102. A substrate 108 may be disposed on the susceptor 103 and may sit opposite a showerhead 110 within the chamber 102. The showerhead 110 may be supported within the chamber 102 by a bracket 114. The substrate 108 may be inserted into the chamber 102 through a slit valve 118 and disposed onto lift pins 142. The susceptor 106 may then rise to meet the substrate 108. The susceptor 106 may be raised on a stem 120 by an actuator 122. A vacuum pump 124 may evacuate the chamber 102.

Gas may be provided to the showerhead 110 from a gas source 132. The gas may pass through a remote plasma source 130 where the gas may be energized into a plasma for cleaning purposes or simply allowed to pass therethrough to the chamber 102. The gas may be ignited into a plasma within the chamber 102 by an RF current applied from an RF power source 128. The gas is initially provided to a plenum 136 disposed between the lid 112 and the upstream side 138 of the showerhead 110. The gas may be substantially evenly distributed within the plenum and then pass through gas passages 116 in the showerhead 110 that extend between the upstream side 138 and the downstream side 140. In one embodiment, the gas passages 116 may comprise hollow cathode cavities. Whenever a plasma is to be generated remotely in the remote plasma source 130, an RF current may be supplied at opposite ends of the remote plasma source 130 from an RF matching network 134.

Figure 2:
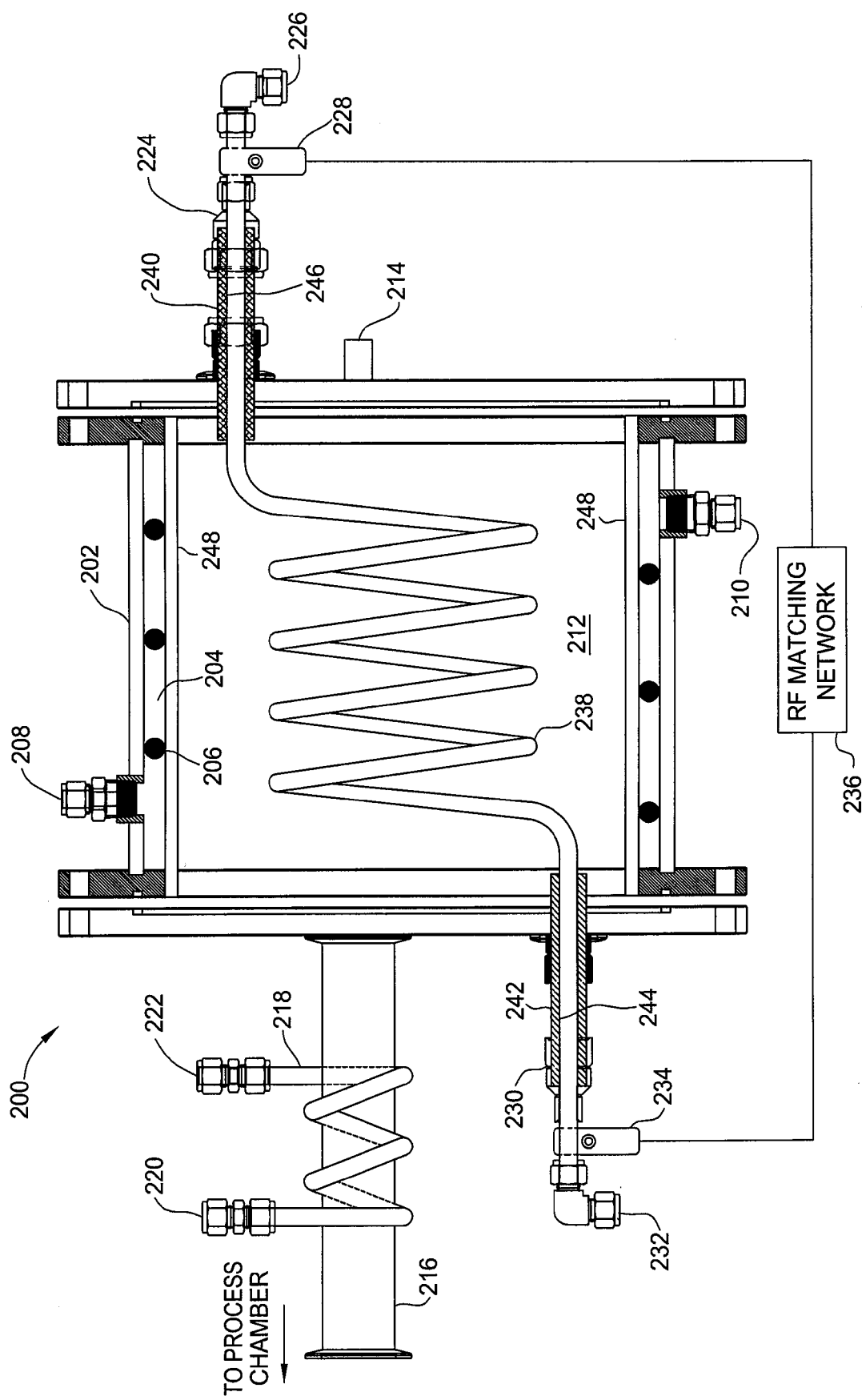
FIG. 2 is a schematic top view of a remote plasma source according to one embodiment of the invention.

FIG. 2 is a schematic top view of a remote plasma source 200 according to one embodiment of the invention. The remote plasma source 200 may comprise a chamber 202 having a wall 204 that has one or more cooling channels 206 therein. Cooling fluid may be provided to the cooling channels 206 through a cooling inlet 210 and exit the cooling channel 206 through a cooling outlet 208. The walls 204 may have conductive surfaces 248 inside the chamber 202 to aid in plasma formation. By cooling the walls 204, any potential sputtering from the walls 202 may be reduced and the remote plasma source 200 lifetime may be increased.

Gas may be fed to the chamber 202 through a gas inlet 214 where it may be ignited into a plasma and then exhausted out a plasma exhaust 216 to a processing chamber. The gas may be ignited into a plasma by an RF current. RF current may flow along the outside of a coil 238 within the chamber 202. The coil 238 may be conductive and comprise a metal. Thus, both the walls 204 and the coil 238 may be conductive. When the plasma is ignited within the chamber 202, the plasma may be surrounded by the conductive material of the coil 238 and the walls 204 rather than insulating material. Because the coil 238 is inside the conductive walls 204 and the plasma forms between the walls 204 and the coil 238, the plasma may not ground and cause the remote plasma source 200 to fail. Additionally, the remote plasma source 200 lifetime may be increased due to the plasma formation outside of the coil 238.

In one embodiment, the gas may comprise a cleaning gas such as $NF_3$, $F_2$, and $SF_6$. In another embodiment, the gas may comprise an etching gas. In still another embodiment, the gas may comprise a deposition gas.

The RF current may be provided from a matching network 236 to the coil 238. The matching network 236 may have a double ended output to provide RF current to opposite ends 224, 230 of the remote plasma source 200. The RF current may be coupled with each end 224, 230 through RF couplings 228, 234. The RF current coupled at RF coupling 234 may be 180 degrees out of phase with the RF current coupled with the RF coupling 228. By providing RF current at two locations that are 180 degrees out of phase with each other, a lower RF current may be supplied. In one embodiment, one RF coupling 228, 234 may be grounded while the other RF coupling 228, 234 is biased. When grounding one RF coupling 228, 234, the RF current provided to the other RF coupling 228, 234 may be double the RF current applied when RF current is applied at both ends 224, 230 out of phase with each other.

The RF current may flow along the outside of metal tubes 244, 246 and the coil 238 between the two ends 224, 230. Outside the chamber 202, the tubes 244, 246 may be surrounded by insulating tubes 240, 242. The metal tubes 244, 246 may be sufficiently thick as to prevent the RF current from penetrating into the interior of the tubes 244, 246. The RF current may flow along the outside of the coil 238 within the chamber 202 and ignite the gas into a plasma within the chamber 202. The coil 238 may comprise a metal such as aluminum.

Because the RF current ignites a plasma within the chamber 202, the coil 238 may be quite hot and could lead to undesired sputtering of the coil 238. If the coil 238 is sputtered, coil material may deposit on the inside of the chamber walls 204. Alternatively, coil material that is sputtered may exit the remote plasma source 200 and enter the processing chamber with the plasma. By cooling the coil 238 with cooling fluid, undesired sputtering may be reduced. Cooling fluid may be supplied to the coil 238 through a cooling inlet 232 and exit the coil 238 through a cooling outlet 226. In one embodiment, the cooling fluid may comprise water. In another embodiment, the cooling fluid may comprise glycol. Based upon the desired RF current to be applied, the thickness of the coil 238 and metal tubes 244, 246 may be predetermined to be thicker than the penetration depth of the RF current. Thus, any coupling of the cooling fluid to the RF current may be reduced.

As may be seen in FIG. 2, the cooling fluid may flow through the inside of the coil 238 counter to the flow of the gas into the chamber 202. Thus, the counter flow may aid in cooling due to the higher temperatures expected near the plasma exhaust 216 as compared to the gas inlet 214. As the plasma is exhausted through the plasma exhaust 216, cooling fluid may be provided to a cooling tube 218 to cool the plasma tube 216 and reduce sputtering or failure of the plasma exhaust 216. Cooling fluid may be provided through a cooling inlet 222 and exit the cooling tube 218 through a cooling outlet 220.

By generating plasma within a conductive enclosure on the outside of a cooled RF coil, high density plasma may be formed at either high or low pressures and then provided to a processing chamber. The cooled coil and cooled conductive walls may reduce sputtering of the coil and wall. The conductive walls and coil of the remote plasma source may reduce the likelihood of failure of the remote plasma source because the grounded, insulating surfaces within the remote plasma source are minimized. Thus, the remote plasma source may have an increased lifetime.

While the foregoing is directed to embodiments of the present invention, other and further embodiments of the invention may be devised without departing from the basic scope thereof, and the scope thereof is determined by the claims that follow.

The invention claimed is:
1. A remote plasma source, comprising:
an enclosure having at least one conductive wall with at least one cooling passage extending within the at least one wall;
a gas inlet coupled with the enclosure at a first wall that is adjacent the at least one conductive wall;
a plasma exhaust coupled with the enclosure at a second wall that is adjacent the at least one conductive wall and opposite the first wall;
a cooling tube wrapped around the plasma exhaust;

a metal coil disposed within the enclosure, the metal coil having an outside surface and an inside surface, the metal coil extending from a first location disposed outside of the first wall to a second location that is outside of the second wall;

an RF input coupled with the outside surface at the first location and the second location; and a first cooling fluid inlet coupled with the inside surface.

2. A plasma apparatus, comprising:

a processing chamber;

an RF matching network; and a remote plasma source coupled with the processing chamber and the RF matching network, the remote plasma source comprising:

an enclosure having at least one conductive wall with at least one cooling passage extending within the at least one wall;

a gas inlet coupled with the enclosure at a first wall that is adjacent the at least one conductive wall;

a plasma exhaust coupled with the enclosure at a second wall that is adjacent the at least one conductive wall and opposite the first wall;

a cooling tube wrapped around the plasma exhaust; and a metal coil extending through the enclosure, the metal coil coupled with a cooling fluid inlet and outlet, and extending from a first location disposed outside of the first wall to a second location that is outside of the second wall, wherein the RF matching network is coupled with the metal coil at the first location and the second location.

3. The plasma apparatus of claim 2, wherein the plasma apparatus is a plasma enhanced chemical vapor deposition apparatus.

4. The plasma apparatus of claim 3, wherein the remote plasma source is spaced from the processing chamber.

5. The plasma apparatus of claim 4, further comprising a showerhead that is disposed within the processing chamber.

* * * * *